United States Patent
Nakayamada

(10) Patent No.: US 9,268,234 B2
(45) Date of Patent: Feb. 23, 2016

(54) CHARGED PARTICLE BEAM LITHOGRAPHY APPARATUS AND CHARGED PARTICLE BEAM PATTERN WRITING METHOD

(71) Applicant: NuFlare Technology, Inc., Numazu-shi (JP)

(72) Inventor: Noriaki Nakayamada, Kanagawa (JP)

(73) Assignee: NuFlare Technology, Inc., Numazu-shi (JP)

(*) Notice: Subject to any disclaimer, the term of this patent is extended or adjusted under 35 U.S.C. 154(b) by 189 days.

(21) Appl. No.: 13/898,904

(22) Filed: May 21, 2013

(65) Prior Publication Data
US 2013/0316288 A1 Nov. 28, 2013

(30) Foreign Application Priority Data
May 22, 2012 (JP) .................................. 2012-116329

(51) Int. Cl.
| | | |
|---|---|---|
| *G03F 7/20* | (2006.01) | |
| *H01J 37/302* | (2006.01) | |
| *H01J 37/317* | (2006.01) | |
| *B82Y 10/00* | (2011.01) | |
| *B82Y 40/00* | (2011.01) | |

(52) U.S. Cl.
CPC .............. *G03F 7/2061* (2013.01); *B82Y 10/00* (2013.01); *B82Y 40/00* (2013.01); *H01J 37/3026* (2013.01); *H01J 37/3174* (2013.01); *G03F 7/2059* (2013.01); *H01J 2237/31776* (2013.01)

(58) Field of Classification Search
CPC ............... G03F 7/2059; G03F 7/2061; H01J 2237/31776; H01J 37/3026; H01J 37/3174; B82Y 10/00; B82Y 40/00
See application file for complete search history.

(56) References Cited

U.S. PATENT DOCUMENTS 5,847,959 A 12/1998 Veneklasen et al.
5,892,237 A * 4/1999 Kawakami et al. ...... 250/492.22

(Continued)

FOREIGN PATENT DOCUMENTS

JP 10-289849 10/1998
JP 2910460 4/1999

(Continued)

OTHER PUBLICATIONS

Takayuki Abe, et al., "Resist heating effect in direct electron beam writing", J. Vac. Sci. Technol. B, vol. 6, No. 3, May/Jun. 1988, pp. 853-857.

*Primary Examiner* — Wyatt Stoffa
(74) *Attorney, Agent, or Firm* — Oblon, McClelland, Maier & Neustadt, L.L.P.

(57) ABSTRACT

A apparatus, includes a unit to operate a number of other correction processing sections written before a relevant correction processing section, to ensure that a calculation time to calculate amounts of temperature rise for the all correction processing sections to does not exceed a pattern writing time for the all correction processing sections by using an average pattern writing time, an average calculation time for one of the amounts of temperature rise, and a degree of parallelism of computers to calculate the amounts of temperature rise; a unit to calculate a representative temperature of the relevant correction processing section based on heat transfers from the other correction processing sections of the number; and a unit to modulate a dose of beam irradiated on the relevant correction processing section by using the representative temperature.

12 Claims, 9 Drawing Sheets

(56) References Cited

U.S. PATENT DOCUMENTS

| | | | |
|---|---|---|---|
| 6,373,071 B1* | 4/2002 | Innes et al. | 250/492.22 |
| 6,379,851 B1* | 4/2002 | Innes | 430/30 |
| 6,420,717 B1* | 7/2002 | Babin et al. | 250/492.2 |
| 6,424,879 B1* | 7/2002 | Chilese et al. | 700/121 |
| 6,720,565 B2 | 4/2004 | Innes et al. | |
| 2002/0148978 A1* | 10/2002 | Innes et al. | 250/492.22 |
| 2009/0001293 A1* | 1/2009 | Sunaoshi | 250/492.22 |
| 2009/0175143 A1* | 7/2009 | Kasono et al. | 369/47.15 |
| 2009/0230316 A1* | 9/2009 | Goto | 250/396 R |
| 2011/0057114 A1* | 3/2011 | Yamada et al. | 250/396 R |
| 2012/0068089 A1* | 3/2012 | Nakayamada et al. | 250/492.22 |
| 2012/0126145 A1* | 5/2012 | Yashima | 250/492.3 |
| 2013/0105108 A1* | 5/2013 | Zywno et al. | 165/11.1 |
| 2014/0114634 A1* | 4/2014 | Song et al. | 703/13 |

FOREIGN PATENT DOCUMENTS

| | | |
|---|---|---|
| JP | 2003-530711 | 10/2003 |
| JP | 2004-505462 | 2/2004 |
| JP | 2005-508528 | 3/2005 |
| JP | 2007-157742 | 6/2007 |
| JP | 4364310 | 8/2009 |
| JP | 2012-69675 | 4/2012 |
| WO | 98/33197 | 7/1998 |
| WO | 01/78104 A1 | 10/2001 |

* cited by examiner

US 9,268,234 B2

CHARGED PARTICLE BEAM LITHOGRAPHY APPARATUS AND CHARGED PARTICLE BEAM PATTERN WRITING METHOD

CROSS-REFERENCE TO RELATED APPLICATION

This application is based upon and claims the benefit of priority from prior Japanese Patent Application No. 2012-116329 filed on May 22, 2012 in Japan, the entire contents of which are incorporated herein by reference.

BACKGROUND OF THE INVENTION

Field of the Invention

Lithography technology leading microprocessing of semiconductor devices is a very important process that, among semiconductor manufacturing processes, solely generates patterns. In recent years, with increasingly higher integration of LSIs, the linewidth of circuits required of semiconductor devices becomes thinner year after year. To form a desired circuit pattern for such semiconductor devices, a high-precision original pattern (also called a reticle or mask) is needed. The electron beam (EB) pattern writing technology has inherently superior resolving power and is used to produce high-precision original patterns.

FIG. 9 is a conceptual diagram to illustrate the operation of a conventional variable-shaped electron beam lithography apparatus.

The variable-shaped electron beam lithography apparatus operates as described below. A first aperture plate 410 has an oblong opening 411 to shape an electron beam 330 formed therein. A second aperture plate 420 has a variable-shaped opening 421 to shape the electron beam 330 having passed through the opening 411 of the first aperture plate 410 to a desired oblong shape formed therein. The electron beam 330 emitted from a charged particle source 430 and having passed through the opening 411 of the first aperture plate 410 is deflected by a deflector and passes through a portion of the variable-shaped opening 421 of the second aperture plate 420 before being irradiated on a target object 340 mounted on a stage continuously moving in a predetermined direction (for example, the X direction). That is, an oblong shape capable of passing through both of the opening 411 of the first aperture plate 410 and the variable-shaped opening 421 of the second aperture plate 420 is written in a pattern writing region of the target object 340 mounted on the stage continuously moving in the X direction. The method of creating any shape by causing the shape to pass through both of the opening 411 of the first aperture plate 410 and the variable-shaped opening 421 of the second aperture plate 420 is called the variable-shaped beam method (VSB method).

With the development of optical lithography technology and a shorter wavelength due to an extreme ultraviolet (EUV), the number of shots of an electron beam needed for mask writing is rapidly increasing. To secure the accuracy of pattern linewidth needed for microprocessing, on the other hand, shot noise and edge roughness of a pattern are attempted to reduce by making the resist less sensitive and increasing the dose. Thus, the number of shots and the dose are increasing boundlessly and so the pattern writing time is also increasing boundlessly. Therefore, reducing the pattern writing time by increasing the current density is being examined.

However, if an attempt is made to flash an increased amount of irradiation energy with an electron beam of higher density in a shorter time, the substrate is heated up, causing a problem of the phenomenon called resist heating in which resist sensitivity changes and the accuracy of pattern linewidth deteriorates. To solve the above problem, the inventors filed a patent application of a method of calculating a representative temperature of the minimum deflection region for each minimum deflection region of deflection regions based on heat transfer from other minimum deflection regions written before the minimum deflection region to modulate the dose by using the representative temperature (see Japanese Patent Application Laid-Open (JP-A) No. 2012-069675). By using such a method, dimensional error of a pattern caused by resist heating has been suppressed by performing faster correction operations by making corrections in units of minimum deflection regions, instead of shots. However, as a result of thorough examination by the inventors and others, even if such a method is used, there are some cases when the speed of calculating corrections cannot keep pace with the speed of writing a pattern and it is difficult to perform pattern writing processing smoothly in real time.

Even if the method of JP-A No. 2012-069675 is used, as described above, the speed of calculating corrections may not be able to keep pace with the speed of writing a pattern, causing a problem that it may be difficult to perform pattern writing processing smoothly in real time. For example, there are some cases when the speed of calculating corrections and the speed of writing a pattern differ by a factor of about several tens to hundred.

BRIEF SUMMARY OF THE INVENTION

In accordance with one aspect of the present invention, a charged particle beam lithography apparatus, includes:

a number operation unit configured to operate a number of a plurality of other correction processing sections written before a relevant correction processing section of all correction processing sections, the relevant correction processing section being used to calculate amounts of temperature rise, to ensure that a calculation time to calculate amounts of temperature rise for the all correction processing sections to be written to does not exceed a pattern writing time to write a pattern on the all correction processing sections by using an average pattern writing time for one of the all correction processing section determined by using a dose of a charged particle beam, a current density of the charged particle beam, and a settling time between shots of the charged particle beam to correct dimensional error of the pattern caused by resist heating, an average calculation time to calculate one of the amounts of temperature rise of the relevant correction processing section caused by heat transfer from one of the plurality of other correction processing sections written before the relevant correction processing section, and a degree of parallelism of computers to calculate the amounts of temperature rise;

a representative temperature calculator configured to calculate a representative temperature of the relevant correction processing section based on heat transfers from the plurality of other correction processing sections of the number written before the relevant correction processing section for each of the all correction processing sections;

a dose modulation unit configured to input a dose of the charged particle beam irradiated on the relevant correction processing section and to modulate the dose of the charged particle beam irradiated on the relevant correction processing section by using the representative temperature of the relevant correction processing section, for each of the all correction processing sections; and a pattern writing unit configured to write a pattern onto the relevant correction processing section by the charged particle beam of the modulated dose.

In accordance with another aspect of the present invention, a charged particle beam pattern writing method, includes:

operating a number of a plurality of other correction processing sections written before a relevant correction processing section of all correction processing sections, the relevant correction processing section being used to calculate amounts of temperature rise, to ensure that a calculation time to calculate amounts of temperature rise for the all correction processing sections to be written to does not exceed a pattern writing time to write a pattern on the all correction processing sections by using an average pattern writing time for one of the all correction processing sections determined by using a dose of a charged particle beam, a current density of the charged particle beam, and a settling time between shots of the charged particle beam to correct dimensional error of the pattern caused by resist heating, an average calculation time to calculate an amount of temperature rise of the relevant correction processing section caused by heat transfer from one of the plurality of other correction processing sections written before the relevant correction processing section, and a degree of parallelism of computers to calculate the amounts of temperature rise;

calculating a representative temperature of the relevant correction processing section based on heat transfers from the plurality of other correction processing sections of the number written before the relevant correction processing section, for each of the all correction processing sections;

inputting a dose of the charged particle beam irradiated on the relevant correction processing section and modulating the dose of the charged particle beam irradiated on the relevant correction processing section by using the representative temperature of the relevant correction processing section, for each of the all correction processing sections; and writing a pattern onto the relevant correction processing section by the charged particle beam of the modulated dose.

DETAILED DESCRIPTION OF THE INVENTION

First Embodiment

In an embodiment below, an apparatus and a method capable of writing a pattern by suppressing dimensional error of the pattern caused by resist heating while preventing the speed of calculating corrections from falling behind the speed of writing a pattern.

In the embodiment below, a configuration using an electron beam will be described as an example of the charged particle beam. However, the charged particle beam is not limited to the electron beam and a beam using charged particles like an ion beam may also be used. Also, a variable-shaped lithography apparatus will be described as an example of the charged particle beam apparatus.

Figure 1:
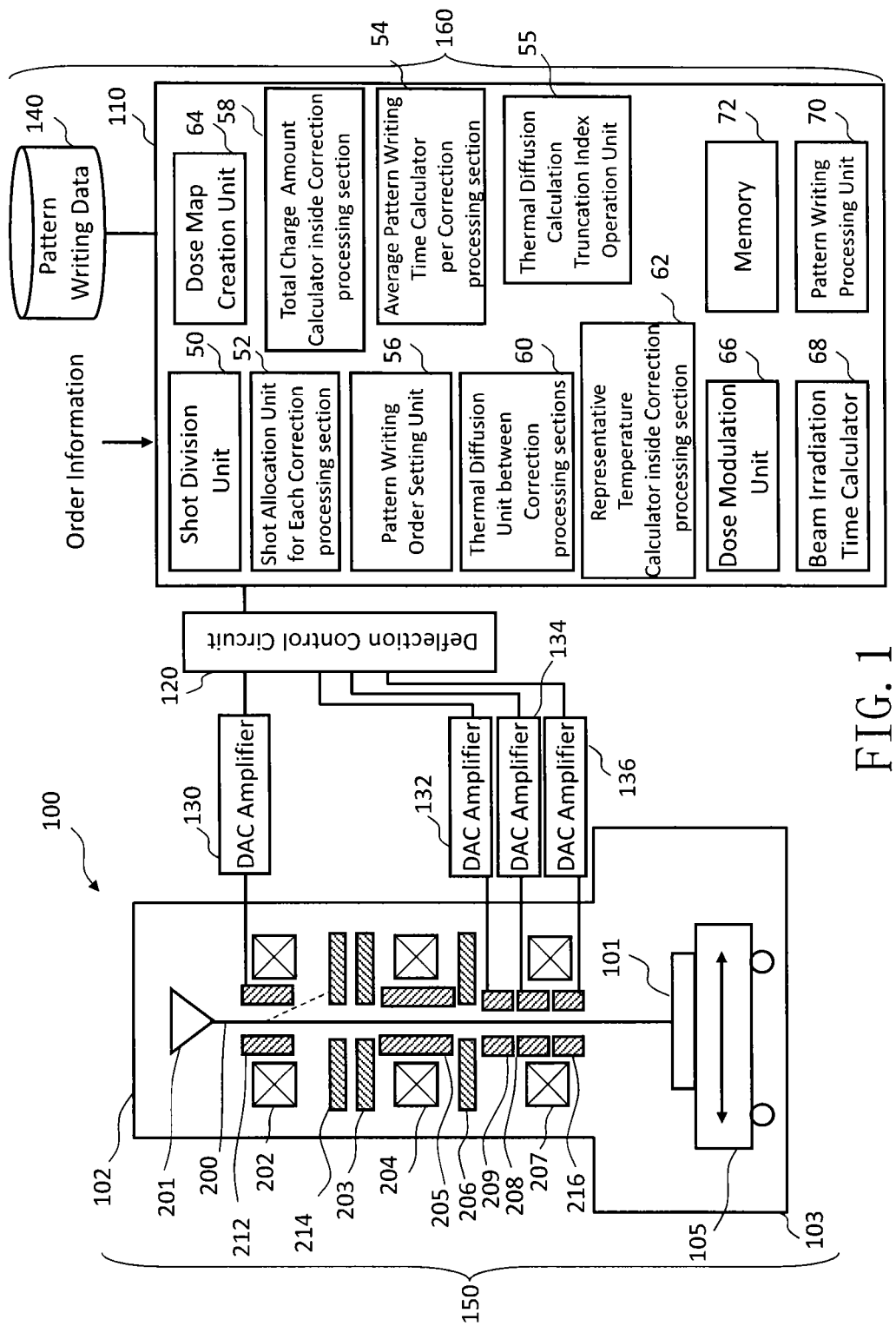
FIG. 1 is a conceptual diagram showing the configuration of a lithography apparatus according to a first embodiment.

FIG. 1 is a conceptual diagram showing the configuration of a lithography apparatus according to the first embodiment. In FIG. 1, a lithography apparatus (or "writing apparatus") 100 includes a pattern writing unit (or "pattern generator") 150 and a control unit 160. The lithography apparatus 100 is an example of the charged particle beam lithography apparatus. Particularly, the lithography apparatus 100 is an example of the variable-shaped beam (VSB type) lithography apparatus. The pattern writing unit 150 includes an electron-optical column 102 and a pattern writing chamber 103. An electron gun assembly 201, an illumination lens 202, a blanking deflector (blanker) 212, a blanking aperture plate 214, a first shaping aperture plate 203, a projection lens 204, a deflector 205, a second shaping aperture plate 206, an objective lens 207, a main deflector 208, a sub-deflector 209, and a sub-sub-deflector 216 are arranged inside the electron-optical column 102. An XY stage 105 movable at least in XY directions is arranged inside the pattern writing chamber 103. A target object 101 (substrate) to be written to which a resist is applied is arranged on the XY stage 105. The target object 101 includes a mask for exposure to manufacture a semiconductor device, silicon wafer and the like. The mask includes mask blanks.

The control unit 160 includes a control computer unit 110, a deflection control circuit 120, DAC (digital/analog converter) amplifier units 130, 132, 134, 136 (deflection amplifiers), and a storage apparatus 140 such as a magnetic disk drive. The control computer unit 110, the deflection control circuit 120, and the storage apparatus 140 such as a magnetic disk drive are mutually connected via a bus (not shown). The DAC amplifier units 130, 132, 134, 136 are connected to the deflection control circuit 120. The DAC amplifier unit 130 is connected to the blanking deflector 212. The DAC amplifier unit 132 is connected to the sub-deflector 209. The DAC amplifier unit 134 is connected to the main deflector 208. The DAC amplifier unit 136 is connected to the sub-sub-deflector 216.

Also, a shot division unit 50, a shot allocation unit 52, an average pattern writing time calculator 54, a truncation index operation unit 55, a pattern writing order setting unit 56, a total charge amount calculator 58, a thermal diffusion calculator 60, a representative temperature calculator 62, a dose map creation unit 64, a dose modulation unit 66, a beam irradiation time calculator 68, a pattern writing processing unit 70, and a memory 72 are arranged inside the control computer unit 110. Each function such as the shot division unit 50, the shot allocation unit 52, the average pattern writing time calculator 54, the truncation index operation unit 55, the pattern writing order setting unit 56, the total charge amount calculator 58, the thermal diffusion calculator 60, the representative temperature calculator 62, the dose map creation unit 64, the dose modulation unit 66, the beam, irradiation time calculator 68, the pattern writing processing unit 70, and the memory 72 may be configured by software such as a program. Alternatively, each function may also be configured by hardware such as an electronic circuit. Alternatively, software and hardware may be combined. Input data needed inside the control computer unit 110 or an operated result is stored in the memory 72 each time. If at least one of the shot division unit 50, the shot allocation unit 52, the average pattern writing time calculator 54, the truncation index operation unit 55, the pattern writing order setting unit 56, the total charge amount calculator 58, the thermal diffusion calculator 60, the representative temperature calculator 62, the dose map creation unit 64, the dose modulation unit 66, the beam irradiation time calculator 68, and the pattern writing processing unit 70 is configured by software, a computer like a CPU or GPU is arranged. Particularly for a function of a large computational quantity such as the thermal diffusion calculator 60 and the representative temperature calculator 62, computers of a plurality of CPUs or a plurality of GPUs are arranged.

Pattern writing data is input from outside and stored in the storage apparatus 140.

In FIG. 1, the configuration needed to describe the first embodiment is shown. Another configuration normally needed for the lithography apparatus 100 may also be included.

Figure 2:
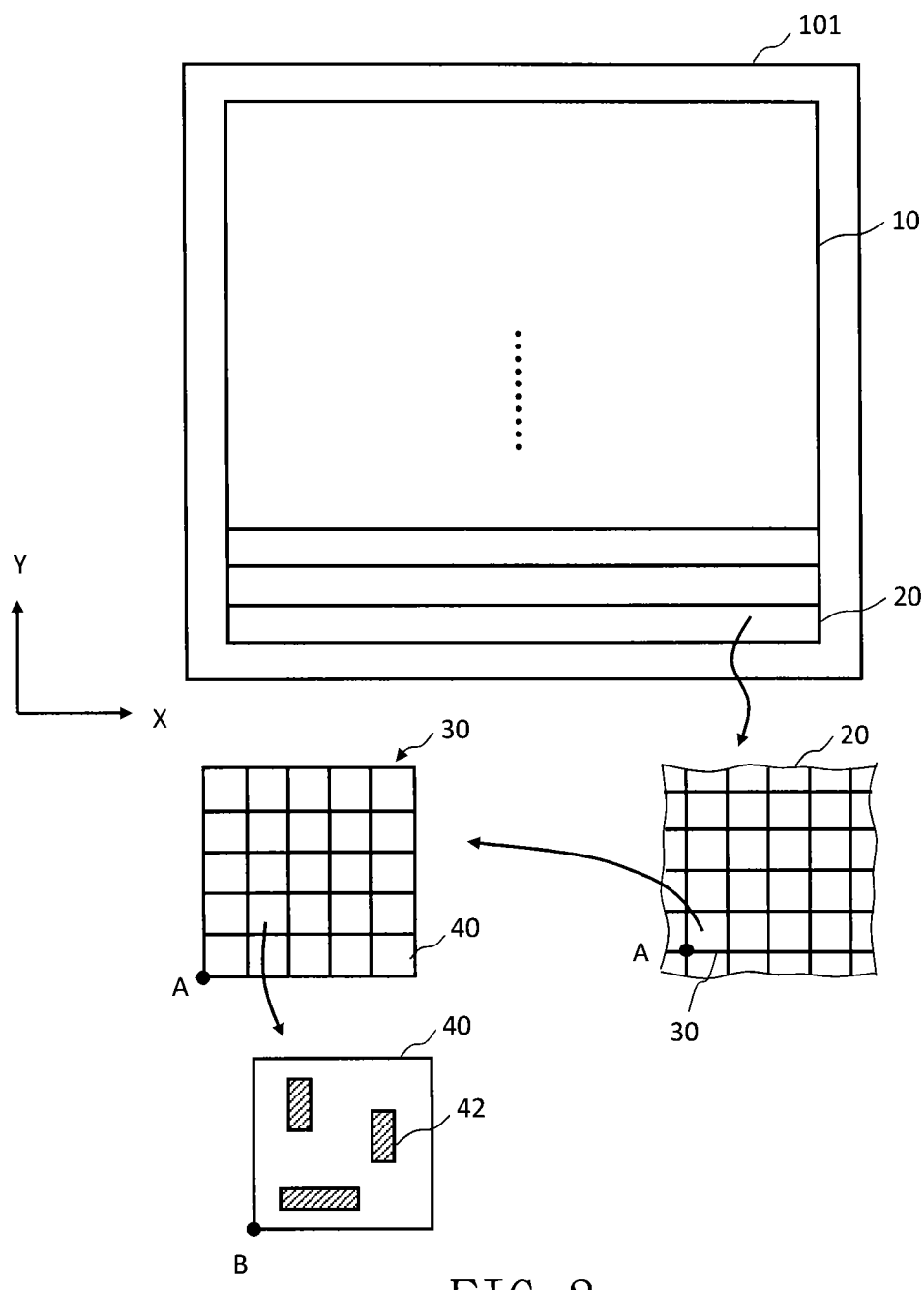
FIG. 2 is a conceptual diagram illustrating each region in the first embodiment.

FIG. 2 is a conceptual diagram illustrating each region in the first embodiment. In FIG. 2, a pattern writing region 10 of the target object 101 is virtually divided into a plurality of stripe regions 20 in a thin rectangular shape toward, for example, the Y direction in a width allowing deflection by the main deflector 208. Each of the stripe regions 20 is virtually divided into a plurality of sub-fields (SF) 30 (small regions) in a mesh shape in a size allowing deflection by the sub-deflector 209. Then, each of SF 30 is virtually divided into a plurality of under sub-fields (USF: here, an abbreviation "TF" of Tertiary Field meaning a third deflection region is used. this also applies below) 40 (small regions) in a mesh shape in a size allowing deflection by the sub-sub-deflector 216. Then, a shot figure is written in each shot position 42 of each of TFs 40. The division number of TF in each SF is desirably a number at which the pattern writing operation is not limited by the thermal diffusion calculation of TF. For example, the division number is desirably 10 or less horizontally and vertically. More suitably, the division number is desirably 5 or less horizontally and vertically.

A digital signal for blanking control is output from the deflection control circuit 120 to the DAC amplifier unit 130. Then, the DAC amplifier unit 130 converts the digital signal into an analog signal and amplifies the analog signal, which is then applied to the blanking deflector 212 as a deflecting voltage. An electron beam 200 is deflected by the deflecting voltage to form a beam of each shot.

A digital signal for main deflection control is output from the deflection control circuit 120 to the DAC amplifier unit 134. Then, the DAC amplifier unit 134 converts the digital signal into an analog signal and amplifies the analog signal, which is then applied to the main deflector 208 as a deflecting voltage. The electron beam 200 is deflected by the deflecting voltage and a beam of each shot is deflected to a reference position of a predetermined sub-field (SF) obtained by virtual division in a mesh shape.

A digital signal for sub-deflection control is output from the deflection control circuit 120 to the DAC amplifier unit 132. Then, the DAC amplifier unit 132 converts the digital signal into an analog signal and amplifies the analog signal, which is then applied to the sub-deflector 209 as a deflecting voltage. The electron beam 200 is deflected by the deflecting voltage and a beam of each shot is deflected to the reference position of an under sub-field (TF) to be the minimum deflection region obtained by further virtual division in a mesh shape inside a predetermined sub-field (SF) obtained by virtual division in a mesh shape.

A digital signal for sub-sub-deflection control is output from the deflection control circuit 120 to the DAC amplifier unit 136. Then, the DAC amplifier unit 136 converts the digital signal into an analog signal and amplifies the analog signal, which is then applied to the sub-sub-deflector 216 as a deflecting voltage. The electron beam 200 is deflected by the deflecting voltage and a beam of each shot is deflected to each shot position of an under sub-field (TF) to be the minimum deflection region obtained by further virtual division in a mesh shape inside a predetermined sub-field (SF) obtained by virtual division in a mesh shape.

In the lithography apparatus 100, pattern writing processing for each of the stripe regions 20 is performed by using deflectors in a plurality of stages. Here, as an example, deflectors in three stages like the main deflector 208, the sub-deflector 209, and the sub-sub-deflector 216 are used. A pattern is written in the first stripe region 20 toward the X direction while the XY stage 105 continuously moves toward the −X direction. Then, when pattern writing in the first stripe region 20 is completed, a pattern is written in the second stripe region 20 in the same manner or toward a reverse direction. A pattern is similarly written in the third and subsequent stripe regions 20. Then, the main deflector 208 (first deflector) successively deflects the electron beam 200 to a reference position A of the SF 30 like following the movement of the XY stage 105. Also, the sub-deflector 209 (second deflector) successively deflects the electron beam 200 from the reference position A of each of the SF 30 to a reference position B of the TF 40. Then, the sub-sub-deflector 216 (third deflector) deflects the electron beam 200 from the reference position B of each of the TF 40 to the shot position 42 of a beam irradiated into the TF 40. Thus, the main deflector 208, the sub-deflector 209, and the sub-sub-deflector 216 have deflection regions different in size. Then, the TF 40 is the minimum deflection region of the deflection regions of the deflectors in the plurality of stages.

Figure 3:
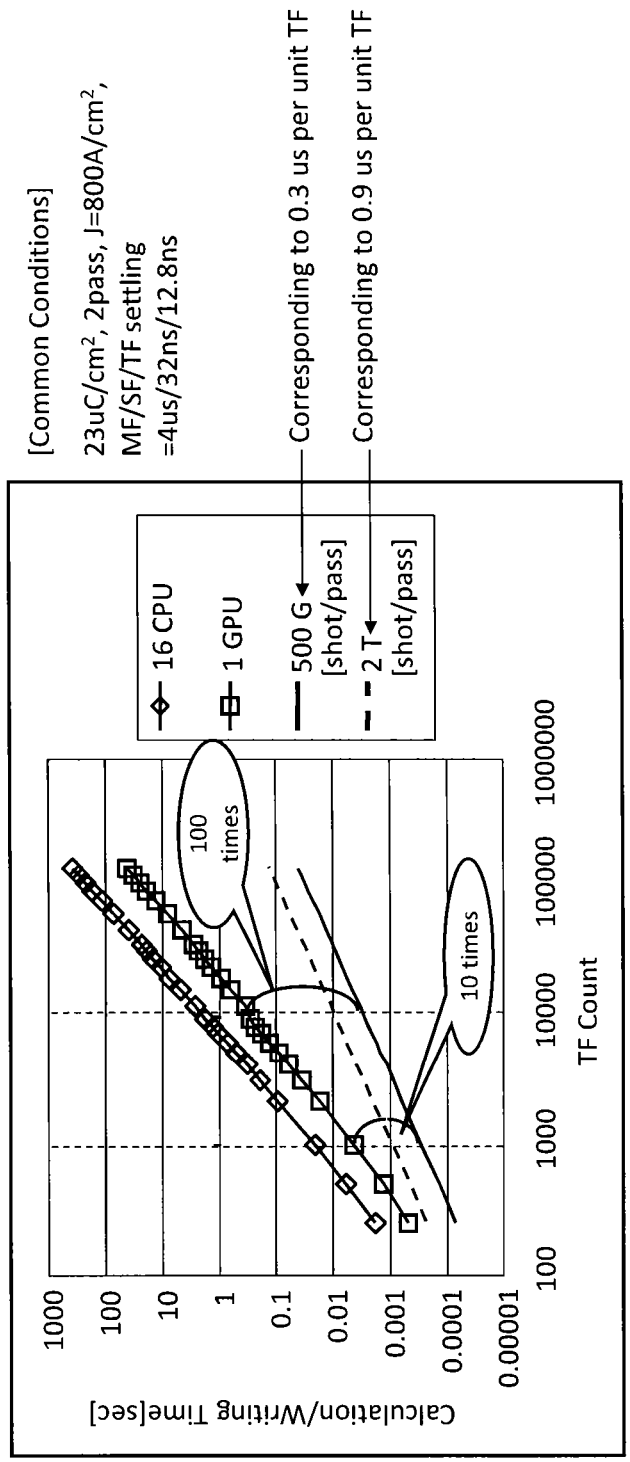
FIG. 3 is a graph comparing a correction calculation time and a pattern writing time for an under sub-field (TF) number to be a comparative example of the first embodiment.

FIG. 3 is a graph comparing a correction calculation time and a pattern writing time for an under sub-field (TF) number to be a comparative example of the first embodiment. For example, the calculation of $TF=10^4$ corresponding to about five columns of SF is assumed. When the correction calculation described in Patent Document 1 described above is performed by using 16 CPUs, the speed of calculating corrections will be about 1000 times slower than the speed of writing a pattern (for example, 500 G shots/pass). When the correction calculation described in Patent Document 1 described above is performed by using one GPU, the speed of calculating corrections will be about 100 times slower than the speed of writing a pattern (for example, 500 G shots/pass). When the calculation of $TF=10^3$ is assumed and the correction calculation described in Patent Document 1 described above is performed by using one GPU, the speed of calculating corrections will be about 10 times slower than the speed of writing a pattern (for example, 500 G shots/pass). Thus, pattern writing processing needs to wait for correction calculation as it stands, which makes smooth pattern writing processing difficult. Thus, in the first embodiment, such a delay is eliminated by adopting a calculation volume matching the calculation speed (resources).

The TF 40 as the minimum deflection region of deflection regions deflected by respective deflectors of the plurality of stages and having different sizes will be used below to describe a correction processing section. However, the correction processing section is not limited to the TF and may be the SF 30. Alternatively, an independent region that is neither the TF 40 nor the SF 30 may be used as the correction processing section. A size smaller than the size of the SF 30 is suitable as the size of the independent region.

Figure 4:
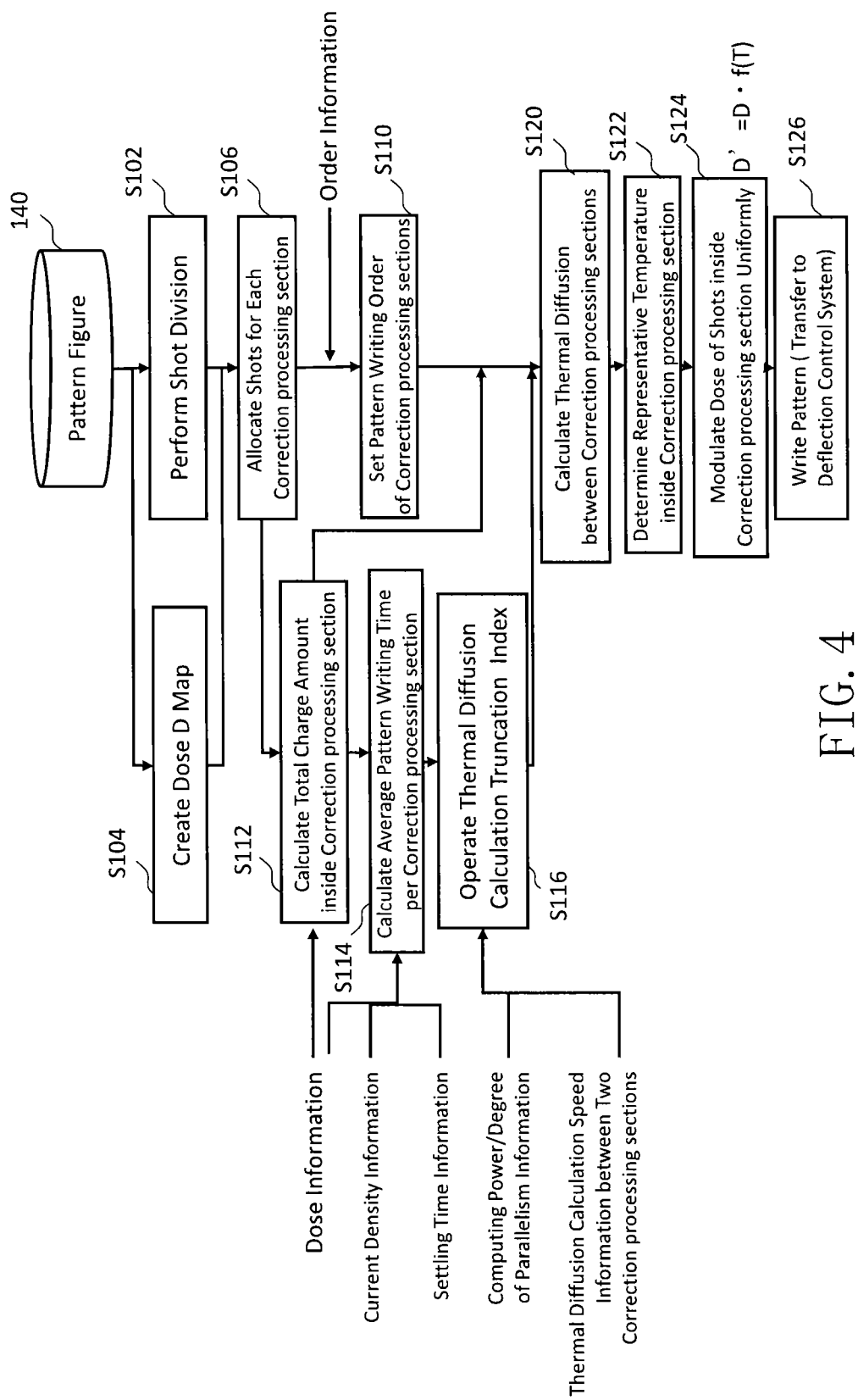
FIG. 4 is a flow chart showing principal processes of a method of writing a pattern according to the first embodiment.

FIG. 4 is a flow chart showing principal processes of a method of writing a pattern according to the first embodiment. In FIG. 4, the method of writing a pattern according to the first embodiment executes a series of processes including a shot division process (S102), a dose map creation process (S104), a shot allocation process (S106), a pattern writing order setting process (S110), a total charge amount calculation process (S112), an average pattern writing time calculation process (S114), a truncation index operation process (S116), a thermal diffusion calculation process (S120), a representative temperature calculation process (S122), a dose modulation process (S124), and a pattern writing process (S126).

As the shot division process (S102), the shot division unit 50 inputs pattern writing data from the storage apparatus 140 and divides a pattern figure into shot figures of each shot by performing data conversion processing in a plurality of stages to generate shot data in a format specific to the lithography apparatus.

As the dose map creation process (S104), the dose map creation unit 64 calculates the dose needed for each mesh region of a predetermined size. Then, the dose map creation unit 64 creates a dose map for the whole pattern writing region or for each stripe region. When a proximity effect is corrected, it is suitable to calculate the dose needed for each proximity effect mesh region. The size of the proximity effect mesh region is suitably a size about ⅒ of the range of influence of the proximity effect. For example, the size thereof is suitably about 1 μm. The dose map creation process (S104) and the shot division process (S102) are suitably executed in parallel. However, the processing is not limited to the above case and both processes may also be executed in series. In such a case, which process to execute first does not matter.

As the shot allocation process (S106), the shot allocation unit 52 allocates each piece of shot data obtained by shot division to the TF 40 in which the relevant shot figure is arranged.

As the pattern writing order setting process (S110), the pattern writing order setting unit 56 sets the order of writing a plurality of TF in the SF for each of the SF 30.

As the total charge amount calculation process (S112), the total charge amount calculator 58 calculates the total amount of charge of the electron beam 200 irradiated into the TF 40 for each of the TF 40 to be the minimum deflection region. The total charge amount calculation process (S112) is suitably executed in parallel with the pattern writing order setting process (S110). However, the processing is not limited to the above case and both processes may also be executed in series. In such a case, which process to execute first does not matter. A total amount of charge Q is calculated as a sum of products of the area of a figure of each shot irradiated in the relevant TF and the dose. The position of the focused TF 40 is denoted by i. The total amount of charge Q(i) in the TF 40 can be defined by the following formula (1) using an area S(k) and a dose D(k) of the k-th shot in the focused TF 40. D(k) and S(k) may be operated by undergoing the shot division process, the dose D map creation process, and the shot allocation process for each correction processing section.

$$Q(i) = \sum_k D(k)S(k) \qquad (1)$$

Figure 5:
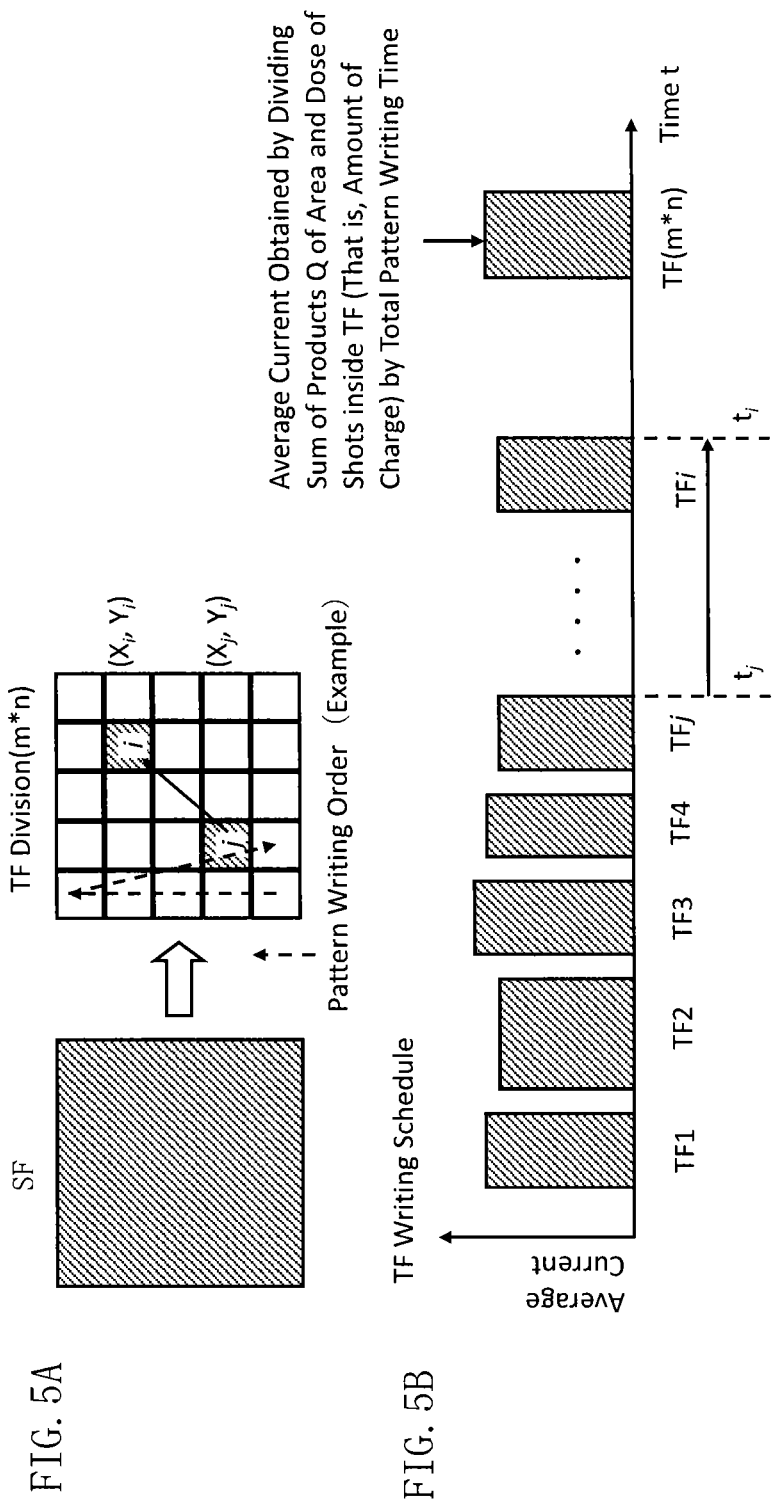
FIGS. 5A and 5B are conceptual diagrams showing a TF writing schedule in SF and the total amount of charge in each TF in the first embodiment.

FIGS. 5A and 5B are conceptual diagrams showing a TF writing schedule in SF and the total amount of charge in each TF in the first embodiment. In FIG. 5A, as an example, a pattern is successively written in the first TF column in the X direction from the TF at the lower left arranged inside the SF toward the Y direction and after pattern writing in the first column in the X direction is completed, a pattern is successively written in each TF in the second TF column in the X direction toward the Y direction. Then, a pattern is successively written in each TF in the third and subsequent TF columns in the X direction toward the Y direction. The example in FIG. 5A shows a case when a pattern is written according to a pattern writing schedule described above. FIG. 5B shows an average current obtained by dividing the total amount of charge Q by the pattern writing time of the TF in the order of pattern writing.

Figure 6:
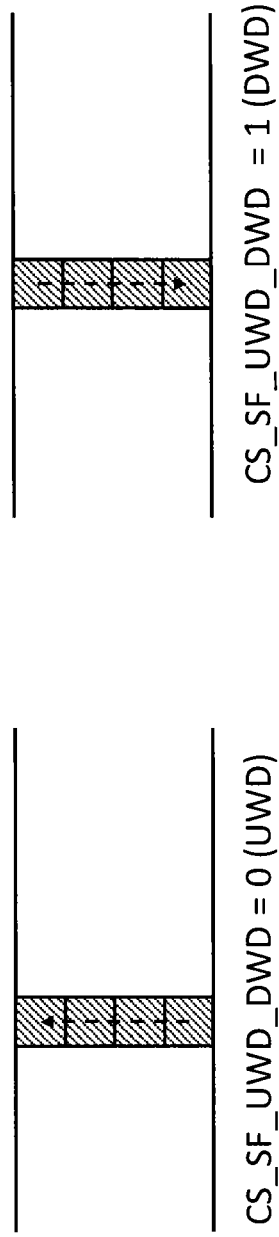
FIGS. 6A and 6B are conceptual diagrams showing an example of the order of writing SF in a stripe region in the first embodiment.

FIGS. 6A and 6B are conceptual diagrams showing an example of the order of writing SF in a stripe region in the first embodiment. For each SF column putting together a plurality of SFs arranged in each stripe in the Y direction, two orders of pattern writing, an upward (UWD) order of pattern writing in which, as shown in FIG. 6A, a pattern is successively written from the Bottom SF toward the Y direction and a downward (DWD) order of pattern writing in which, as shown in FIG. 6B, a pattern is successively written from the top SF toward the −Y direction, can be prepared.

Figure 7:
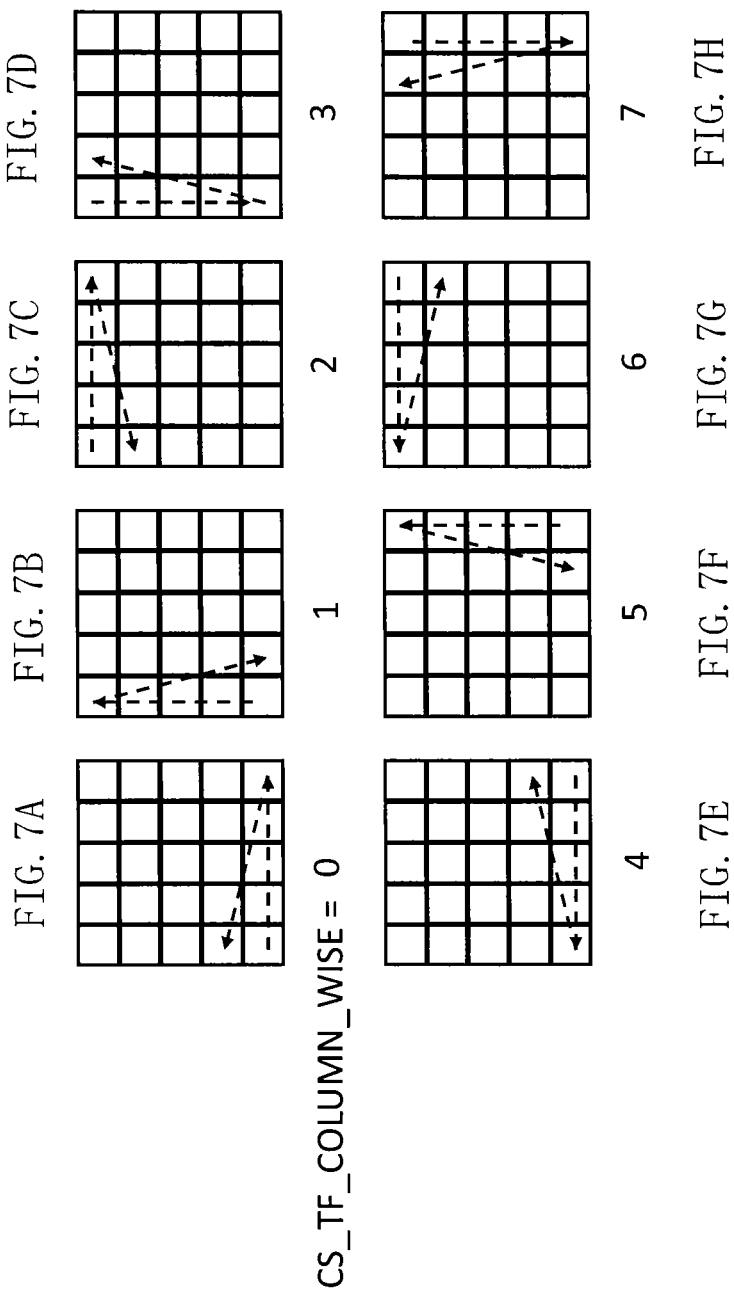
FIGS. 7A to 7H are conceptual diagrams showing an example of the order of writing TF in SF in the first embodiment.

FIGS. 7A to 7H are schematic diagrams showing examples of the writing order of TFs in an SF according to Embodiment 1. The writing orders for TFs in each SF can be prepared as follows:

According to the writing order 0 shown in FIG. 7A, TFs in the first row, which is the first with respect to the y direction, are written in order from the lower left TF in the x direction, and TFs in the second and subsequent rows with respect to the y direction are also written in order from the left end TF in the x direction.

According to the writing order 1 shown in FIG. 7B, TFs in the first column, which is the first with respect to the x direction, are written in order from the lower left TF in the y direction, and TFs in the second and subsequent columns with respect to the x direction are also written in order from the lower end TF in the y direction.

According to the writing order 2 shown in FIG. 7C, TFs in the first row, which is the first with respect to the −y direction, are written in order from the upper left TF in the x direction, and TFs in the second and subsequent rows with respect to the −y direction are also written in order from the left end TF in the x direction.

According to the writing order 3 shown in FIG. 7D, TFs in the first column, which is the first with respect to the x direction, are written in order from the upper left TF in the −y direction, and TFs in the second and subsequent columns with respect to the x direction are also written in order from the upper end TF in the −y direction.

According to the writing order 4 shown in FIG. 7E, TFs in the first row, which is the first with respect to the y direction, are written in order from the lower right TF in the −x direction, and TFs in the second and subsequent rows with respect to the y direction are also written in order from the right end TF in the −x direction.

According to the writing order 5 shown in FIG. 7F, TFs in the first column, which is the first with respect to the −x direction, are written in order from the lower right TF in the y direction, and TFs in the second and subsequent columns with respect to the −x direction are also written in order from the lower end TF in the y direction.

According to the writing order 6 shown in FIG. 7G, TFs in the first row, which is the first with respect to the −y direction, are written in order from the upper right TF in the −x direction, and TFs in the second and subsequent rows with respect to the −y direction are also written in order from the right end TF in the −x direction.

According to the writing order 7 shown in FIG. 7H, TFs in the first column, which is the first with respect to the −x direction, are written in order from the upper right TF in the −y direction, and TFs in the second and subsequent columns with respect to the −x direction are also written in order from the upper end TF in the −y direction.

The order of writing SF and TF may be set by combining the orders of pattern writing in FIGS. 6A, 6B, and 7A to 7H. For example, the order of pattern writing is suitably set as an order in which thermal diffusion is less likely to occur.

As the average pattern writing time calculation process (S114), the average pattern writing time calculator 54 calculates an average pattern writing time for one of the all correction processing section to correct dimensional error of a pattern caused by resist heating. As the correction processing section here, for example, as described above, the TF 40 is used. First, the pattern writing time a(i) of each of the TF 40 will be calculated. The pattern writing time a(i) of each of the TF 40 is determined by using the dose D(k) of the k-th shot in each of the TF 40, the current density J of the electron beam 200, and a settling time s(k) between the k-th and (k+1)-th shots in each of the TF 40. The pattern writing time a(i) of each of the TF 40 can be defined by the following formula (2). Information of the current density J of the electron beam 200 may be input from outside and set. The settling time s(k) between the k-th and (k+1)-th shots may appropriately be set in accordance with the distance between the k-th and (k+1)-th shots based on settling time information input from outside.

$$a(i) = \sum_k \left( \frac{D(k)}{J} + s(k) \right) \quad (2)$$

Then, the average pattern writing time a of the correction processing section to correct dimensional error of a pattern caused by resist heating can be calculated by dividing the sum of all pattern writing times a(i) in the calculated region by the total TF number N. For example, the calculated region is suitably the stripe region 20, the SF 30, or an SF group including a plurality of the SF 30. The average pattern writing time a of the correction processing section (here, the TF 40) is expressed by the following formula (3):

$$a = \frac{\sum_i^N a(i)}{N} \quad (3)$$

The average pattern writing time a of the TF 40 is determined by using, as described above, the dose D(i) of the electron beam 200, the current density J of the electron beam 200, the settling time s(i) between shots of a charged particle beam, and the total TF number N in the calculated region.

As the truncation index operation process (S116), the truncation index operation unit 55 operates the number n of a plurality of the other TF 40 written before the TF 40 used for calculating the amount of temperature rise so that the calculation time to calculate the amount of temperature rise for all the TF 40 (correction processing section) to be written to does not exceed the pattern writing time to write a pattern in all the TF 40. The truncation index operation unit 55 is an example of a number operation unit. The number n of the plurality of the other TF 40 is operated by using the average pattern writing time a of the TF 40, an average calculation time b to calculate the amount of temperature rise of the TF 40 caused by heat transfer of one of the plurality of the other TF 40 written before the TF 40, and a degree of parallelism m of the computer to calculate the amount of temperature rise. More specifically, the number n of the plurality of the other TF 40 is calculated so that the following formula (4) is satisfied by using the average pattern writing time a, the average calculation time b, the degree of parallelism m of the computer, and the total number N of all the TF 40 to be written to. Information of the degree of parallelism m of the computer and information of the average calculation time b (thermal diffusion calculation speed information between two correction processing sections) may be input from outside and set.

$$aN > b\left\{ \frac{n(n-1)}{2} + n(N-n) \right\} / m \quad (4)$$

When, for example, N>>1, instead of the formula (4), the number n of the plurality of the other TF 40 may be calculated so that the following formula (5) is satisfied:

$$ma/b > n - n^2/2N \quad (5)$$

As the thermal diffusion calculation process (S120), the thermal diffusion calculator 60 calculates for each of the TF 40 amounts of temperature rise δTij caused by heat transfers from the other TF 40s written before the TF 40. The thermal diffusion calculator 60 is an example of a temperature rise amount calculator. Each amount of temperature rise δTij of the amounts of temperature rise shows an amount of temperature rise of the i-th TFi caused by heat transfer from the other j-thTFj. The amount of temperature rise δTij depends on an elapsed time (ti−tj) until a pattern is written in the TF at time ti after a pattern is written in another TF at time tj. The amount of temperature rise δTij can be defined by the following formula (6) by using a temperature rise A(Qj) by TFj alone dependent on the total amount of charge Qj of TFj, the thermal diffusion coefficient K, the Grun Range Rg, coordinates (Xi,Yi) of TFi, coordinates (Xj, Yj) of TFj, the pattern writing time ti of TFi, and the pattern writing time tj of TFj. In the formula (6), as an example, a case of approximation by ignoring diffusion during TF irradiation in a rectangular parallelepiped approximation in the Z (depth) direction is shown.

$$\delta T_{ij} = A(Q_j) \cdot \mathrm{erf}\left( \frac{R_g}{2K\sqrt{t_i - t_j}} \right) \cdot \frac{1}{4\pi K^2 (t_i - t_j)} \exp\left\{ -\frac{(x_i - x_j)^2 + (y_i - y_j)^2}{4K^2(t_i - t_j)} \right\} \quad (6)$$

In the formula (6), the thermal diffusion coefficient K is a coefficient expressed as $K^2[(mm)^2/s] = \lambda/(\rho Cp)$. In the formula (6), λ is the thermal conductivity [W/(K·m)], ρ is the gram density [g/cm$^3$], and Cp is the specific heat [J/(K·g)]. The Grun Range Rg in the formula (6) is expressed by the following formula (7):

$$Rg=(0.046/\rho)*E^{1.75} [\mu m] \quad (7)$$

The Grun Range Rg represents an average range approximation in the depth direction when an electron beam of energy E[keV] is vertically incident on a material whose gram density is ρ[g/cm$^3$]. A(Qj) can be expressed, as an example, as A=(E·Qj)/(ρCp·Rg·S). Qj is the total amount of charge [fC] (femto Coulomb) of TFj, S is the area [μm$^2$] of the minimum deflection region, and E, ρ, Cp, and Rg are as described above. In the formula (6), erf( ) is an error function.

The thermal diffusion calculator 60 calculates each amount of temperature rise δTij received from each of the plurality of the other TF 40 up to the number n determined in the truncation index operation process (S116) from the TF 40 of all the other TF 40 written before the TF 40 for each of the TF 40 in the SF 30.

Because, as described above, the calculation time b far exceeds the pattern writing time if each amount of temperature rise δTij received from all the other TF 40 written before the TF 40 is calculated, the calculation volume is reduced by limiting the number n of the other TF 40 written before the relevant TF 40 in the first embodiment so that the speed of calculating corrections should not exceed the speed of writing a pattern.

As the representative temperature calculation process (S122), the representative temperature calculator 62 calculates the representative temperature Ti of the TF 40 based on heat transfer from the plurality of the other TF 40 of the number n written before the TF 40 for each of the TF 40. The representative temperature calculator 62 is an example of a representative temperature calculator. The representative temperature calculator 62 determines the representative temperature Ti of the TF by cumulatively adding each amount of temperature rise δTij caused by heat transfer from the plurality of the other TF of the number n written before the TF. The representative temperature Ti is defined by the following formula (8):

$$T_i = \sum_{j=1}^{n} \delta T_{ij} \quad (8)$$

Figure 8:
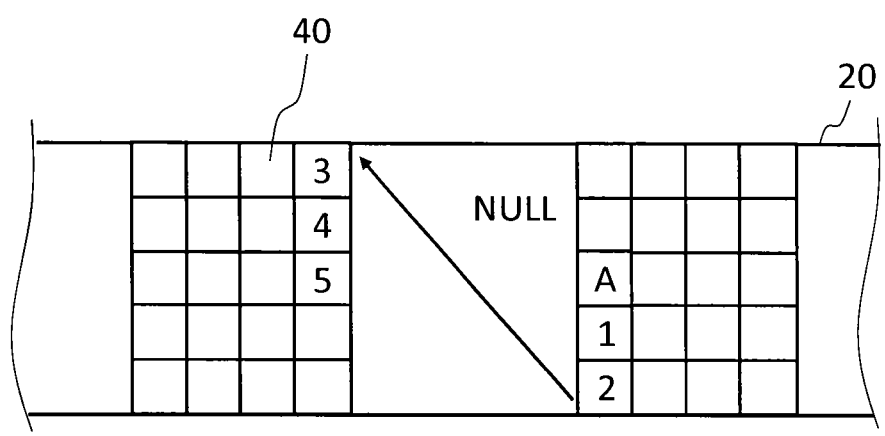
FIG. 8 is a diagram showing an example of other TF of a number n written before focused TF in the first embodiment.
Figure 9:
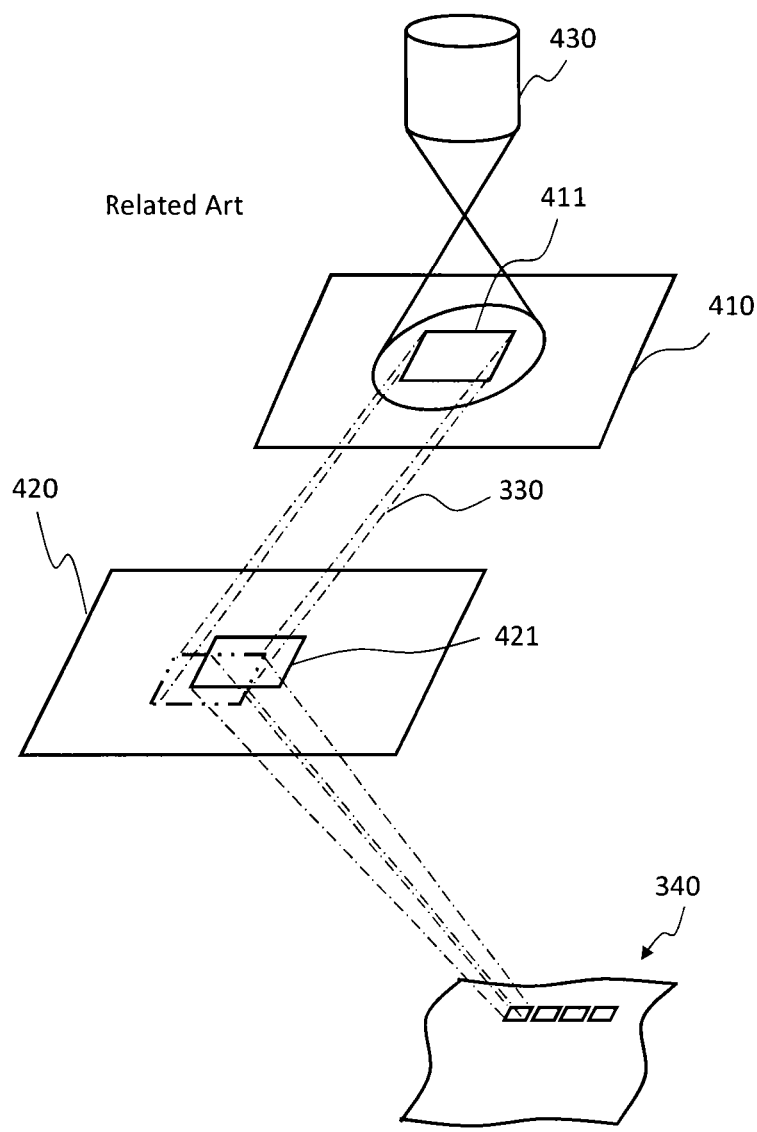
FIG. 9 is a conceptual diagram to illustrate the operation of a variable-shaped electron beam lithography apparatus.

FIG. 8 is a diagram showing an example of other TF of the number n written before focused TF in the first embodiment. If, as shown in FIG. 8, a NULL region where no pattern to be written is present exists therebetween when as many the TF 40 as n (here, for example, five) are traced back from the focused TF 40 indicated by A, the TF 40 to be included for calculation is suitably set so as to further trace back by excluding the NULL region.

As the dose modulation process (S124), the dose modulation unit 66 inputs the dose D (first dose) of the electron beam determined for each shot of the beam irradiated on the TFi to modulate the dose D (first dose) for each shot of the beam irradiated on the TFi by using the representative temperature Ti of the TFi for each of the TF 40. A dose D' (second dose) after the modulation can be determined by D'=D·f(Ti). A uniform percentage modulation f(Ti) value is always used when writing a shot in the TFi.

In the first embodiment, the range of deflection can be made smaller by dividing the SF 30 into the still smaller TF 40 so that the DAC amplifier 136 for the sub-sub-deflector 216 can be made faster. Thus, the speed of writing a pattern in each TF can be made faster than the speed of thermal diffusion. Therefore, approximations ignoring thermal diffusion during TF irradiation can be validated. As a result, resist heating corrections can be made with high precision.

As the pattern writing process (S126), first the beam irradiation time calculator 68 calculates the beam irradiation time for each shot. The beam irradiation time can be determined by dividing the dose D' (second dose) after modulation by the current density J. Then, when each shot is written, the pattern writing processing unit 70 controls the deflection control circuit 120 so that the beam irradiation time becomes a time corresponding to each shot. The pattern writing processing unit 70 starts pattern writing processing by controlling the pattern writing unit 150 via the deflection control circuit 120 or the like. The pattern writing unit 150 writes a desired pattern on the target object 101 by using the electron beam 200 of the dose D' (second dose) after modulation obtained for each shot. More specifically, the pattern writing unit 150 operates as follows. The deflection control circuit 120 outputs a digital signal to control the beam irradiation time for each shot to the DAC amplifier unit 130. Then, the DAC amplifier unit 130 converts the digital signal into an analog signal and amplifies the analog signal, which is then applied to the blanking deflector 212 as a deflecting voltage.

The electron beam 200 emitted from the electron gun assembly 201 (discharge unit) is controlled by the blanking deflector 212 to pass through the blanking aperture plate 214 when passing through the blanking deflector 212 in a beam ON state and the whole beam is deflected so as to be shielded by the blanking aperture plate 214 in a beam OFF state. The electron beam 200 having passed through the blanking aperture plate 214 between the transition from the beam OFF state to the beam ON state and the subsequent transition to the beam OFF state becomes one shot of the electron beam. The blanking deflector 212 generates the beam ON state and the beam OFF state alternately by controlling the orientation of the passing electron beam 200. For example, no voltage may be applied for the beam ON state and a voltage may be applied to the blanking deflector 212 for the beam OFF state. The dose per shot of the electron beam 200 irradiated on the target object 101 is adjusted by the beam irradiation time of each shot.

The electron beam 200 of each shot generated by passing through the blanking deflector 212 and the blanking aperture plate 214 as described above illuminates the whole first shaping aperture plate 203 having an oblong, for example, rectangular hole through the illumination lens 202. Here, the electron beam 200 is first formed into an oblong, for example, rectangular shape. Then, the electron beam 200 in a first aperture plate image after passing through the first shaping aperture plate 203 is projected on the second shaping aperture plate 206 through the projection lens 204. The first aperture plate image on the second shaping aperture plate 206 can be changed (variable-shaped) in beam shape and dimensions by deflection control of the deflector 205. Such variable-shaping is done for each shot and a beam shape and dimensions are formed differently in each normal shot. Then, the electron beam 200 in a second aperture image after passing through the second shaping aperture plate 206 is focused by the objective lens 207 and deflected by the main deflector 208, the sub-deflector 209, and the sub-sub-deflector 216 before being irradiated on a desired position of the target object 101 arranged on the XY stage 105 moving continuously. As described above, a plurality of shots of the electron beam 200 is successively deflected onto the target object 101 to be the substrate by each deflector.

According to the first embodiment, as described above, dimensional error of a pattern caused by resist heating can be suppressed while preventing the speed of calculating corrections from falling behind the speed of writing a pattern. Therefore, a pattern can smoothly be written in more precise dimensions in real time.

Incidentally, the faster the speed of writing a pattern, that is, the shorter the average pattern writing time a, the smaller the number n (truncation index) of the other TF 40 written before the target TF 40. However, if the shot density is the same, the dose decreases with an increasing speed of writing a pattern and resist heating is reduced correspondingly. Therefore, a harmful influence of degradation in calculation precision due to smallness of the number n (truncation index) can also be mitigated. The determination of the number n (truncation index) should be made based on a spatial distance and a time difference between TF and another TF. However, if the direction of writing a pattern is preset in one direction, for example, upward from below, TF temporally past is also spatially far away. Therefore, disadvantages of simply truncating at the number of TF are not big.

In the foregoing, an embodiment has been described with reference to concrete examples. However, the present invention is not limited to such concrete examples. In the above examples, the calculation speed is made faster by limiting the number n of TF written in the past for correction calculation, but the present invention is not limited to such examples. For example, the number n of TF written in the past for correction calculation may be specified in advance to determine the degree of parallelism m of the computer satisfying the formula (4). Resources may be arranged by fitting to the degree of parallelism m of such a computer. Degradation in calculation precision due to smallness of the number n (truncation index) decreases as an error with an increasing n before convergence at some number. Therefore, when, for example, the number n (truncation index) after such convergence is set, conversely the degree of parallelism m of a computer is suitably determined.

Portions that are not directly needed for the description of the present invention such as the apparatus configuration, control method and the like are omitted, but the apparatus configuration and control method that are needed may appropriately be selected and used. For example, the description of the configuration of a control unit that controls the lithography apparatus 100 is omitted, but it is needless to say that the configuration of the control unit that is needed may appropriately be selected and used.

In addition, all charged particle beam lithography apparatuses and methods that include elements of the present invention and whose design can be changed as appropriate by persons skilled in the art are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam lithography apparatus, comprising:
a number operation unit configured to calculate a number of a plurality of other correction processing sections written before a relevant correction processing section of all correction processing sections, the relevant correction processing section being used to calculate amounts of temperature rise, to ensure that a calculation time to calculate amounts of temperature rise for the all correction processing sections to be written to does not exceed a pattern writing time to write a pattern on the all correction processing sections by using an average pattern writing time for one of the all correction processing sections determined by using a dose of a charged particle beam, a current density of the charged particle beam, and a settling time between shots of the charged particle beam to correct dimensional error of the pattern caused by resist heating, an average calculation time to calculate one of the amounts of temperature rise of the relevant correction processing section caused by heat transfer from one of the plurality of other correction processing sections written before the relevant correction processing section, and a degree of parallelism of computers to calculate the amounts of temperature rise;
a representative temperature calculator configured to calculate a representative temperature of the relevant correction processing section based on heat transfers from the plurality of other correction processing sections corresponding to the number calculated, written before the relevant correction processing section, for each of correction processing sections having the another correction processing sections written before the relevant correction processing section, of the all correction processing sections;
a dose modulation unit configured to input a dose of the charged particle beam irradiated on the relevant correction processing section and to modulate the dose of the charged particle beam irradiated on the relevant correction processing section by using the representative temperature of the relevant correction processing section, for each of the correction processing sections having the another correction processing sections written before the relevant correction processing section, of the all correction processing sections; and
a pattern writing unit configured to write a pattern onto the relevant correction processing section by the charged particle beam of the modulated dose.

2. The apparatus according to claim 1, wherein the pattern writing unit has deflectors of a plurality of stages that deflect the charged particle beam and
each of the all correction processing section is a minimum deflection region of deflection regions of different sizes respectively deflected by the deflectors of the plurality of stages.

3. The apparatus according to claim 1, wherein the number n of the plurality of other correction processing sections is calculated to satisfy a following formula (4) by using the average pattern writing time a, the average calculation time b, the degree of parallelism m of the computers, and a number N of the all correction processing sections to be written $$aN > b\left\{\frac{n(n-1)}{2} + n(N-n)\right\}/m. \quad (4)$$

4. The apparatus according to claim 1, further comprising:
a temperature rise amount calculator configured to calculate amounts of temperature rise caused by heat transfers from the plurality of other correction processing sections corresponding to the number calculated, written before the relevant correction processing section, for each of the correction processing sections having the another correction processing sections written before the relevant correction processing section, of the all correction processing sections,
wherein the representative temperature calculator determines the representative temperature of the relevant correction processing section by cumulatively adding each of the amounts of temperature rise caused by the heat transfers from the plurality of other correction processing sections of the number written before the relevant correction processing section.

5. The apparatus according to claim 1, further comprising: a total charge amount calculator configured to calculate a total amount of charge of the charged particle beam irradiated onto the relevant correction processing section, for each of the all correction processing sections.

6. The apparatus according to claim 1, further comprising: an average pattern writing time calculator configured to calculate the average pattern writing time for one of the all correction processing sections to correct dimensional error of the pattern caused by the resist heating.

7. A charged particle beam pattern writing method, comprising:
calculating a number of a plurality of other correction processing sections written before a relevant correction processing section of all correction processing sections, the relevant correction processing section being used to calculate amounts of temperature rise, to ensure that a calculation time to calculate amounts of temperature rise for the all correction processing sections to be written to does not exceed a pattern writing time to write a pattern on the all correction processing sections by using an average pattern writing time for one of the all correction processing sections determined by using a dose of a charged particle beam, a current density of the charged particle beam, and a settling time between shots of the charged particle beam to correct dimensional error of the pattern caused by resist heating, an average calculation time to calculate an amount of temperature rise of the relevant correction processing section caused by heat transfer from one of the plurality of other correction processing sections written before the relevant correction processing section, and a degree of parallelism of computers to calculate the amounts of temperature rise;
calculating a representative temperature of the relevant correction processing section based on heat transfers from the plurality of other correction processing sections corresponding to the number calculated, written before the relevant correction processing section, for each of correction processing sections having the another correction processing sections written before the relevant correction processing section, of the all correction processing sections;
inputting a dose of the charged particle beam irradiated on the relevant correction processing section and modulating the dose of the charged particle beam irradiated on the relevant correction processing section by using the representative temperature of the relevant correction processing section, for each of the correction processing sections having the another correction processing sections written before the relevant correction processing section, of the all correction processing sections; and
writing a pattern onto the relevant correction processing section by the charged particle beam of the modulated dose.

8. The method according to claim 7, wherein each of the all correction processing sections is a minimum deflection region of deflection regions of different sizes respectively deflected by the deflectors of the plurality of stages that deflect the charged particle beam.

9. The method according to claim 7, wherein the number n of the plurality of other correction processing sections is calculated to satisfy a following formula (4) by using the average pattern writing time a, the average calculation time b, the degree of parallelism m of the computers, and a number N of the all correction processing sections to be written $$aN > b\left\{\frac{n(n-1)}{2} + n(N-n)\right\}\bigg/m. \tag{4}$$

10. The method according to claim 7, further comprising: calculating amounts of temperature rise caused by the heat transfers from the plurality of other correction processing sections corresponding to the number calculated, written before the relevant correction processing section, for each of the correction processing sections having the another correction processing sections written before the relevant correction processing section, of the all correction processing sections,
wherein when the representative temperature is calculated, the representative temperature of the relevant correction processing section is determined by cumulatively adding each of the amounts of temperature rise caused by the heat transfers from the plurality of other correction processing sections of the number written before the relevant correction processing section.

11. The method according to claim 7, further comprising: calculating a total amount of charge of the charged particle beam irradiated onto the relevant correction processing section for each of the correction processing sections.

12. The method according to claim 7, further comprising: calculating the average pattern writing time for one of the all correction processing sections to correct dimensional error of the pattern caused by the resist heating.

* * * * *